(12) United States Patent
Gutnik et al.

(10) Patent No.: US 6,661,860 B1
(45) Date of Patent: Dec. 9, 2003

(54) MULTIPLE ARBITER JITTER ESTIMATION SYSTEM AND RELATED TECHNIQUES

(75) Inventors: Vadim Gutnik, Irvine, CA (US); Anantha Chandrakasan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/478,106

(22) Filed: Jan. 4, 2000

(51) Int. Cl.[7] .......................... H04L 7/00; H04B 17/00
(52) U.S. Cl. .................. 375/354; 375/356; 375/226
(58) Field of Search ................ 375/371, 373, 375/376, 356, 364, 224, 226; 370/516, 517, 518, 519

(56) References Cited

U.S. PATENT DOCUMENTS

| | | | |
|---|---|---|---|
| 3,737,766 A | 6/1973 | Lubarsky, Jr. ............ 324/57 R |
| 3,820,022 A | 6/1974 | Watt .......................... 324/83 D |
| 4,412,299 A | 10/1983 | Huffman ..................... 364/570 |
| 4,654,586 A | 3/1987 | Evans, Jr. et al. ........ 324/83 D |
| 4,819,080 A | 4/1989 | Cucchietti et al. ........ 324/83 R |
| 4,975,634 A | 12/1990 | Shohet ....................... 324/83 R |
| 4,998,027 A | 3/1991 | Mihara et al. .............. 307/445 |
| 5,610,543 A | 3/1997 | Chang et al. |
| 5,778,217 A | * | 7/1998 | Kao ............................ 713/503 |
| 5,825,211 A | 10/1998 | Smith et al. |
| 5,844,436 A | 12/1998 | Altmann |
| 6,556,583 B1 | * | 4/2003 | Hayashi et al. ............. 370/463 |

OTHER PUBLICATIONS

Vadim Gutnik et al., "On–Chip time measurement," Symposium on VLSI Circuit Digest of Technical Papers, 2000, pp. 52–53.*

* cited by examiner

*Primary Examiner*—Tesfaldet Bocure
(74) *Attorney, Agent, or Firm*—Daly, Crowley & Mofford, LLP (57) ABSTRACT

A digital circuit includes a plurality of arbiters, each arbiter having first and second input ports and an output port at which is provided an arbiter output signal. Each first input of the plurality of arbiters is connected to a first common line and each second input of the plurality of arbiters is connected to a second common line. The digital circuit further includes a decision circuit, having a plurality of inputs and an output, with each of the inputs of the decision circuit coupled to a corresponding one of the output of the plurality of arbiters. The decision circuit provides an output signal indicative of the time difference between a signal fed to the first common line and a signal fed to the second common line. With such an arrangement, phase jitter or timing jitter in a clock network can be measured with relatively high resolution and the system cam resolve cycle-by-cycle jitter with a predetermined resolution.

19 Claims, 6 Drawing Sheets

*Figure 1*

| -30 psec ARBITER 1 | -20 psec ARBITER 2 | -10 psec ARBITER 3 | ARBITER 4 0 | 10 psec ARBITER 5 | 20 psec ARBITER 6 | 30 psec ARBITER 7 | dT (psec) |
|---|---|---|---|---|---|---|---|
| 0 | 0 | 0 | 0 | 0 | 0 | 0 | >-30±5 |
| 1 | 0 | 0 | 0 | 0 | 0 | 0 | >-25±5 |
| 1 | 1 | 0 | 0 | 0 | 0 | 0 | >-5±5 |
| 1 | 1 | 1 | 0 | 0 | 0 | 0 | >-0±5 |
| 1 | 1 | 1 | 1 | 0 | 0 | 0 | >-5±5 |
| 1 | 1 | 1 | 1 | 1 | 0 | 0 | >-15±5 |
| 1 | 1 | 1 | 1 | 1 | 1 | 0 | >-25±5 |
| 1 | 1 | 1 | 1 | 1 | 1 | 1 | >-30±5 |

MULTIPLE ARBITER JITTER ESTIMATION SYSTEM AND RELATED TECHNIQUES

CROSS-REFERENCE TO RELATED APPLICATIONS

Not applicable.

STATEMENTS REGARDING FEDERALLY SPONSORED RESEARCH

This invention was made with government support under Grant No. CCR-9501995 awarded by the National Science Foundation and Grant Number DAAL01-95-K-3526 awarded by the U.S. Army. The government has certain rights in the invention.

FIELD OF THE INVENTION

This invention relates generally to digital circuits and more particularly to systems and techniques to measure the time difference between arrival of two digital signal edges at a particular terminal or port of a circuit.

BACKGROUND OF THE INVENTION

In digital applications, much of the design process involves finding means to satisfy desired timing constraints between various clock and data signals. Deviation from an ideal, i.e. perfectly periodic, fully in-phase, clock over a chip degrades the achievable performance of a design because such clock imperfection requires that either the system clock runs slower, or extra logic is added to ensure correct performance. In particular, uncertainty or inconsistency in the instantaneous period of a digital clock, or spatial variation in the arrival time of corresponding edges of a clock must be characterized in order to optimize the design of such systems as large microprocessors, or digital signal processing chips. While off-chip methods exist to measure the average performance of a digital clock, the instantaneous worst-case behavior of the clock constrains the design, and that cannot be measured by looking at averaged waveforms using, for example, electron beam analysis, or photonic emission methods. Very precise timing information could also help characterize and debug radio communications signals where data is encoded in phase variations of a carrier signal.

As is known in the art, an arbiter circuit, or simply an arbiter, is a digital circuit used to indicate which of two signals arrives first (i.e., the voltage of which signal transitions from a logic '0' to a logic '1' first) at a particular point. It should be appreciated that the electrical characteristics of one arbiter as compared to another arbiter will vary due to differences in manufacturing tolerances, which cause the arbiter to be biased towards one input signal rather than another. It is conventionally assumed that the arbiter does not give a consistently correct output if the temporal difference between the rising transitions of the arbiter's two input signals is smaller than a certain minimum. This minimum time is called a "decision window," and is now typically 50 picoseconds.

It would be desirable to provide a circuit or technique to determine which of a pair of signals arrives first at a given point in a system to better than 10 picosecond resolution; and further to measure the temporal difference between pairs of signals with precision better than 10 picoseconds. Such a circuit or technique would enable more precise and accurate characterization of digital clocks, and hence higher performance of digital systems, and furthermore may be useful in debugging and testing radio frequency communications systems.

SUMMARY OF THE INVENTION

In accordance with the present invention, a digital circuit includes a plurality of arbiters, each arbiter having first and second input ports and an output port providing an output signal. Each first input of the plurality of arbiters is connected to a first common line and each second input of the plurality of arbiters is connected to a second common line. The output signal of each arbiter will transition to a first state if a first input signal is high and a second input signal is low. The digital circuit further includes a decision circuit, having a plurality of inputs and an output. Each of the inputs of the decision circuit is connected to a corresponding output of one of the plurality of arbiters. The decision circuit output provides a signal indicative of the time difference between a signal fed to the first common line and a signal fed to the second common line. With such an arrangement, the difference in arrival times can be measured between digital signal edges of two pulses, which can be used to measure jitter or debugging communication systems.

In accordance with a further aspect of the present invention, the digital circuit further includes a plurality of bias circuits, each bias circuit providing a bias signal or a bias characteristic to a corresponding one of the plurality of the arbiters. The bias circuit provides each arbiter with an offset such that the arbiter acts as if one input were delayed. With such an arrangement, cross-over times among different arbiters can be varied.

In accordance with a still further aspect of the invention, a method for determining the electrical characteristics of the arbiters involves the steps of providing one digital signal on a first common input to a set of arbiters, and another digital signal on a second common input of the set of arbiters, and then deducing from resulting outputs of the arbiters and the known statistics of the input signals, electrical characteristics of the individual arbiters.

In accordance with a still further aspect of the present invention, a method for indicating the time difference between respective edges of two digital signal pulses includes the steps of providing a first digital signal to a first input of each of a plurality of arbiters and providing a second digital signal to a second input of each of the plurality of arbiters. The method further includes the steps of providing an output signal from each arbiter with the signal level of the output signal of each arbiter dependent upon the determination by the arbiter of which of the first and second input digital signals arrive first at the arbiter and providing each of the arbiter output signals to a decision circuit which uses the arbiter output signals to determine the difference in arrival times between each edge of the first and second input digital signals. With such a technique, a digital circuit is provided that can be used to measure phase jitter with higher precision than prior art techniques.

In accordance with a further aspect of the present invention, the method comprises selecting a plurality of arbiters having different transition or crossover points which transition at different instances in time with like input signals. With such a technique, phase jitter can be measured with greater than 10 picoseconds precision and as high as two picoseconds precision.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Before providing a detailed description of the invention, it may be helpful to review the state of the art of arbiters and techniques used to measure phase jitter. An arbiter is a digital circuit that samples digital input signals and compares the two signals and indicates which of two digital signal edges arrives first. For example, when two signals, signal SigA and signal SigB are fed to the arbiter, if signal SigA arrives first, then the arbiter will provides an output signal having a high or a logic 1 value. Similarly, if signal SigB arrives first, then the arbiter provides an output signal having a low or a logic 0 value.

It is well known that if a time delay, "dT" between rising clock edges of two input signals fed to an arbiter is larger than some decision window, "dW", (i.e. dT>dW) the arbiter will correctly determine which signal arrived first. The arbiter will thus provide an output signal having a value which correctly identifies which signal came first.

Typically such a decision window is now on the order of 50 picoseconds. If, however, the time delay, "dT" between rising clock edges of two input signals is smaller than the decision window, "dW" (i.e. dT<dW), the output of the arbiter is not well determined. It should be appreciated that the electrical characteristics of one arbiter to another arbiter will vary due to differences in manufacturing tolerances which affect noise characteristics, transfer curves and the like. The latter variance determines the tolerance of the arbiter and sets the range of the decision window, dW. As digital circuits increase in speed, it is desirable to measure phase jitter or timing jitter in the clock network and more specifically be able to resolve cycle-by-cycle jitter with better than 10 picosecond resolution. This would be useful to IC designers of, for example, high-speed microprocessors and jitter measurement will become increasingly important as microprocessor speeds approach and exceed the 1 Ghz range. Jitter measurement is also desirable in serial communication systems, where high-speed phase measurement is also needed to correlate high speed clocks.

With a primary goal to measure cycle-to-cycle phase jitter, it is necessary to measure with high accuracy and very quickly, the time difference between two digital edges, the time difference being referred to as dT. We have discovered one way to do this is to build arbiters with slightly different crossover points, meaning transition or crossover points which transition at different instances in time with like input signals. Then after every sample, one could say the true time difference lies between the times corresponding to the crossover points of two closest arbiters. By construction, one of them will output a 0, and the other will output a 1. More specifically, using arbiters that outputs a 0 if signal SigA precedes signal SigB and outputs a 1 if signal SigB precedes signal SigA by greater than 50 picoseconds (psec), if sixteen arbiters are connected in parallel with sixteen different crossover points, then if all sixteen arbiters output a 0, we know that signal SigA arrived at least 50 psec before signal SigB. If 14 arbiters output a 0 and two arbiters output a 1, then signal SigA probably arrived before signal SigB, but by less than 50 psec. If 8 arbiters output a 0 and 8 arbiters output a 1, then signal SigA and signal SigB arrived at the same time plus or minus a couple picoseconds. If two arbiters output a 1 and 14 arbiters a 0 then signal SigA arrived after signal SigB, but by less than 50 psec. If all 16 arbiters output a 0, then signal SigA arrived after signal SigB by at least 50 picoseconds. It should be appreciated that the number of arbiters used can vary depending on the required accuracy. The exact time difference that corresponds to any particular number of arbiters can be deduced by testing and calibration with known (or, importantly, random) signals.

Figure 1:
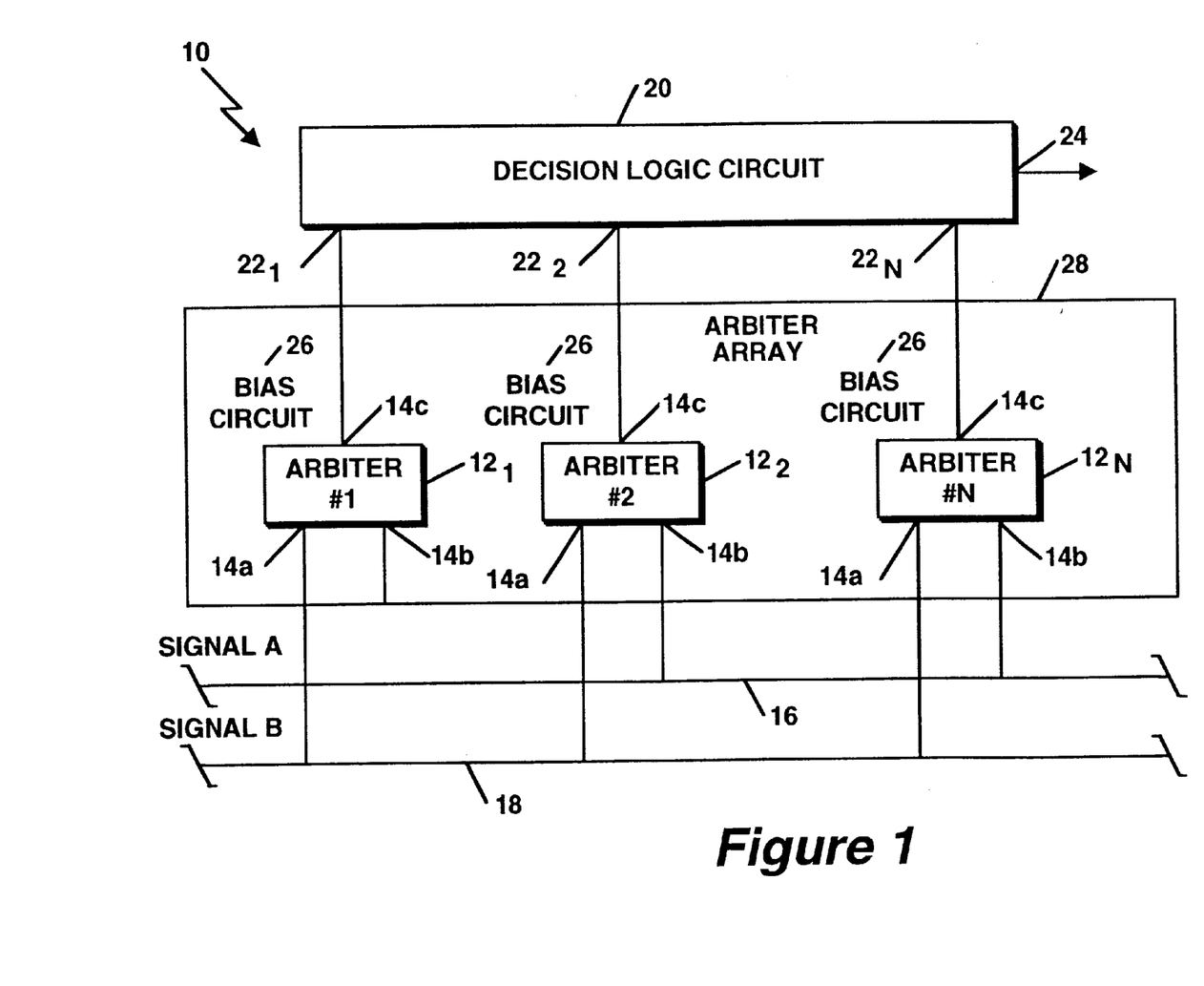
FIG. 1 is a block diagram of a digital circuit according to the invention.
Figure 1A:
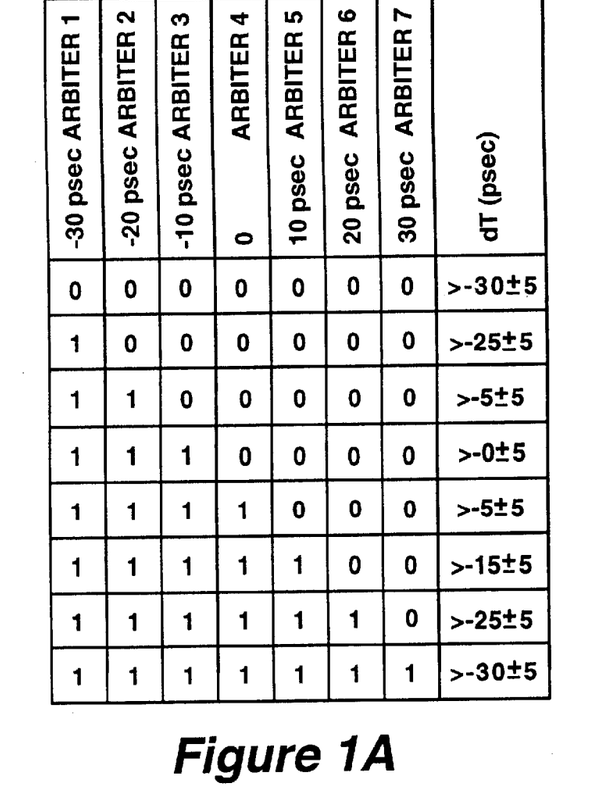
FIG. 1A is a table showing a digital value for various timing differences according to the invention.
Figure 2:
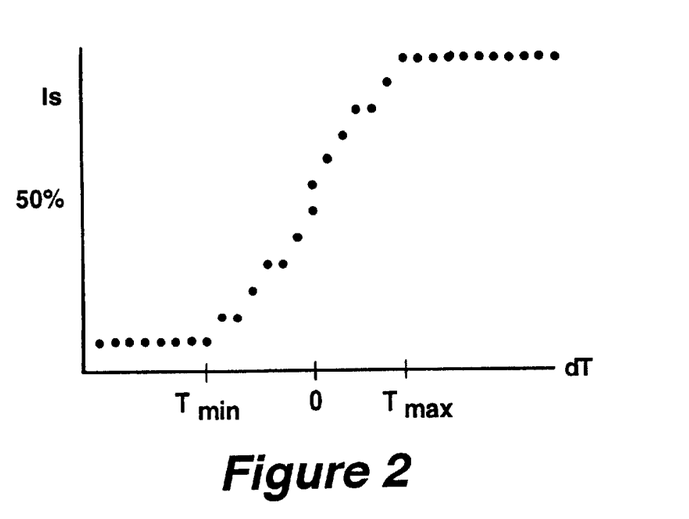
FIG. 2 is chart plotting the fraction of arbiters outputting a one vs dT.

Referring now to FIG. 1A, a table is shown showing seven arbiters with crossover times of −30 psec, −20 psec, −10 psec, 0 psec, 10 psec, 20 psec and 30 psec. After the two signal edges have passed, if the output is 1110000, then the time difference, dT, between the two signal edges was between 0 and −10 psec or −5 psec ±5 psec. If, after two signal edges go by, the output is 1111110, then dT was between 20 psec and 30 psec or 25 psec ±5 psec. From the table of FIG. 1A, the various outputs provide the time difference between the two signals. The number of arbiters can vary, i.e. space them more finely to get better time resolution. An obstacle with the above approach is it is difficult to build arbiters with this kind of precision. We typically have control of crossover points at a resolution of about one gate delay, which is on the order of 50 psec. So, if we design at a crossover point of 10 psec, we will probably get a crossover point between −15 psec and 35 psec. Furthermore, arbiters are subject to supply noise and random thermal noise. So, even if we somehow built the arbiters as shown above, sometimes, we would get an output such as 1001100. To overcome the latter, if we build a plurality of arbiters and try to make them identical, the arbiters will turn out to have some variation due to manufacturing processing differences. Then, we determine what the crossover points actually are, as though they had been built that way. In the ideal case, if the arbiters were to turn out to be identical, one could still perform the measurement. Because of thermal noise in the system, if signal SigA and signal SigB are exactly aligned, about one-half of the arbiters will output "1" and one-half will output "0". If signal SigA arrives first, i.e. leads, signal SigB by some difference of time, dT, some different fraction of arbiters will output "1"s. One could imagine plotting the fraction of 1s vs dT. It would approximate FIG. 2. If the decision window for the arbiters is 50 psec and the arbiters are exactly identical, Tmax−Tmin=50 psec, then the resolution of the system is approximately (Tmax−Tmin)/(number of arbiters). If the arbiters are actually fabricated slightly differently, Tmin will get smaller and Tmax will get larger and the resolution will decrease. At times it may be desirable to measure a larger range of dT than provided with the normal distribution of fabricated arbiters. To increase the range of dT, we might bias some of the arbiters to switch later and some of the arbiters to switch earlier. This will stretch or expand dT i.e. Tmax−Tmin in the same manner that fabrication differences provides. Thus, the resolution and the bandwidth of the detection window can be controlled by the number of arbiters utilized and the amount of bias control exerted on each arbiter.

A method to calibrate the arbiters is to take advantage of the random noise. Consider two arbiters, arbiters A1 and A2, which were fabricated to be identical, but of course are not because of processing variations. The two arbiters are tested by inputting two signals that have a range of dTs, let's say +/−200 picoseconds, resulting in arbiter A1 being more likely to output a 1 than arbiter A2. If arbiter A1 never outputs a 0 when arbiter A2 outputs a 1, then the crossover point of arbiter A1 is at least 50 picoseconds (psec) earlier than the crossover point of arbiter A2. If arbiter A1 outputs a 0 when arbiter A2 outputs a 1 approximately one-half of the time (but just less than one-half of the time), then the cross over points of the two arbiters are very close. This is based on that arbiter A1 is more likely to output a 1 than is arbiter A2. Now, for any pair of arbiters, the difference in crossover points can be calculated and by repeating the test, the relationship of a plurality of arbiters to one another can be calculated and then stored to provide a table similar to the table of FIG. 1A.

Referring now to FIG. 1, in accordance with the present invention, a digital circuit 10 which resolves the difference between the edge of two digital input signals, SigA and SigB, includes an arbiter array 28 having a plurality of arbiters, here shown to be N arbiters $12_1$, $12_2$ . . . $12_N$, generally denoted 12. Each arbiter 12 includes a first and second input, 14a and 14b, respectively, and an output 14c the output 14c is coupled to a decision logic circuit 20.

The first input 14a of each of the plurality of arbiters 12 is connected to a common line 16 wherein the first digital signal, SigA is fed to provide SigA to each of the arbiters 12. The second input 14b of each of the plurality of arbiters 12 is connected to a common line 18 wherein the second digital signal, SigB is fed to provide SigB to each of the arbiters 12. When the two signals, signal SigA and signal SigB are fed to the arbiters 12, if signal SigA arrives first, then each arbiter 12 provides at port 14c an output signal having a high or a logic 1 value. Conversely, if signal SigB arrives first, then each arbiter 12 provides at port 14c an output signal having a low or a logic 0 value. Thus, in response to the pair of input signals being provided to arbiter inputs 14a, 14b, the arbiter provides an output signal at output 14c which is coupled to a decision logic circuit 20.

As explained above, however, in some cases (i.e. when dT<dW) the arbiters are unable to reliably resolve with acceptable probability, which of the two signals arrived first at the arbiter. Thus in this case some the arbiters will provide at port 14c an output signal having a high or a logic 1 value while other of the arbiters 12 will provide at port 14c an output signal having a low or a logic 0 value.

In any event, all of the arbiter output signals are provided to a decision circuit 20. The decision circuit 20 includes a plurality of inputs $22_1$, $22_2$ . . . $22_N$ and an output 24. Each of the inputs $22_1$, $22_2$ . . . $22_N$ of the decision circuit are coupled to a corresponding output 14c of one of the plurality of arbiters $12_1$, $12_2$ . . . $12_N$. In response to the output signals provided thereto from the arbiters 12, the decision circuit 20 provides at output 24 a digital signal indicating the difference in time, dT, between signal SigA and signal SigB. More particularly, depending upon the number of the plurality of arbiters $12_1$, $12_2$ . . . $12_N$ provide at the ports 14c an output signal having a high or logic 1 value, the decision circuit 20 provides an output signal at port 24 indicating the time difference between the edges of the two digital signals in a manner as described above. It should be appreciated the measurement of the time difference between the edges is a measurement of the cycle-to-cycle phase jitter.

To measure dT between two clock signals on an integrated circuit (IC) (call them SigA and SigB as in our example), the signals are fed to an array of arbiters, here arbiters $12_1$, $12_2$ . . . $12_N$. If dT<dW, some of the arbiters will indicate that SigA came first, and some will indicate that SigB came first. The fraction of arbiters that indicate SigA came first (call it "r") will go from 0 to 1 as dT goes from −dW to dW, i.e. from one edge of the arbitration window to the other edge. In the simplest case, the fraction will be approximately 0.5 when the signals are exactly aligned. The exact shape of the "r vs. dT" graph, similar to the graph shown in FIG. 2, depends on the noise in the system (i.e. thermal noise), and manufacturing variations among the arbiters as described above. By using the fraction of ones (highs) to measure phase difference, you can measure phase difference with higher precision. By using multiple arbiters, you are averaging over multiple arbiters to get linearity and average noise. With this technique, it is possible to keep improving accuracy and precision simply by adding more arbiters to the arbiter array 28 as described above. As described below, an algorithm to measure the r vs. dT curve for a particular array is useful, so that r, which is a digital output, can be converted to dT. Results indicate that resolution on the order of greater than 2 picoseconds are possible.

Figure 2A:
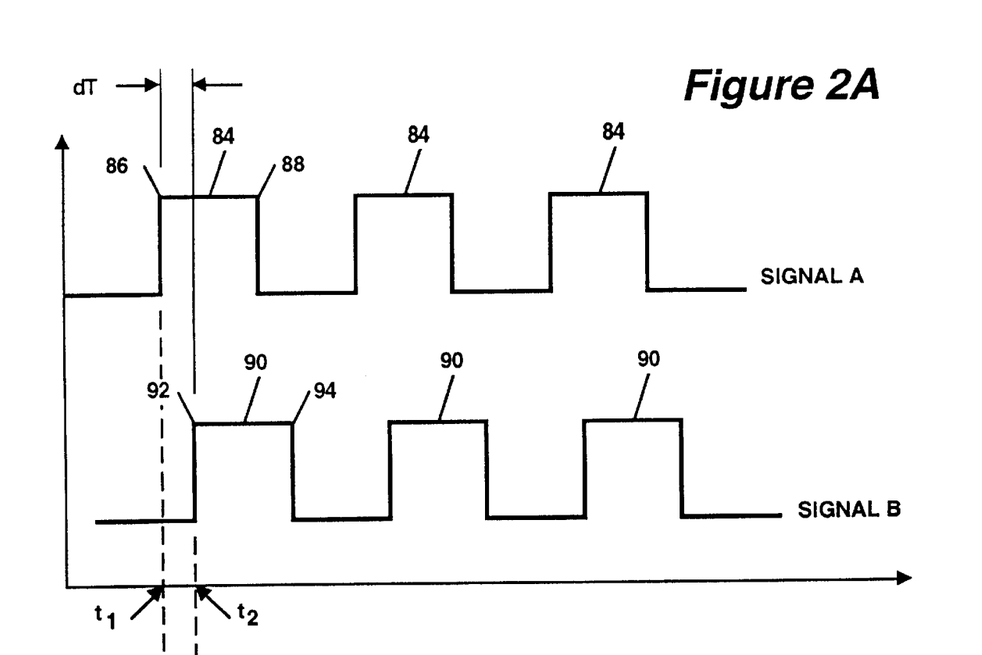
FIGS. 2A and 2B are an exemplary timing diagram showing the timing relationship of various arbiters.

Referring now to FIG. 2A, a plot of two digital pulse waveforms or signals, here SigA and SigB, are shown. As shown, a leading edge 86 of a pulse 84 of signal SigA is shown to transition from a low to a high at a time $t_1$. A leading edge 92 of a pulse 90 of signal SigB is shown to transition from a low to a high at a time $t_2$. It should be appreciated, the difference in time between the pulses 84 and 90 of respective signal SigA and signal SigB is $t_2-t_1$ which is equal to dT. As shown, if signal SigA and signal SigB were fed to an arbiter and dT is greater than the decision window, dW, or resolution of the arbiter, then the output of the arbiter would transition high at time $t_1$.

Figure 2B:
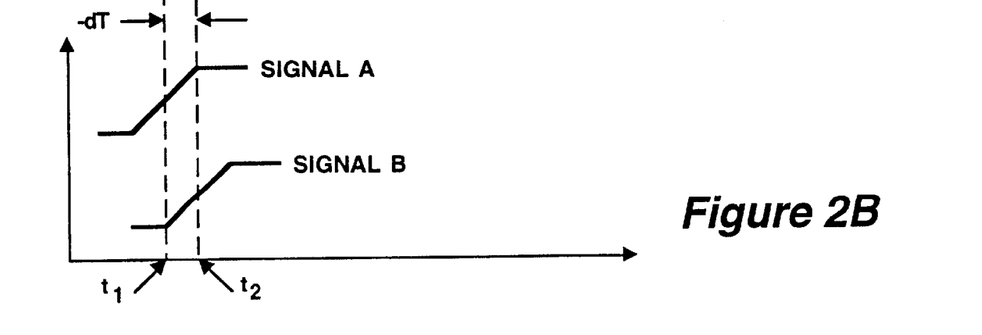

It should be appreciated that the pulses in FIG. 2A are shown as ideal pulses and actual pulses have an associated slope and rise time as shown in FIG. 2B. For example, output signals provided by practical arbiters have an associated slope and rise time. The slope and rise time are determined by a variety of factors, including but not limited to the electrical characteristics of the digital circuit and associated signal paths on which the signals propagate. As the pulse transitions form a low to a high, the center of the slope is typically referred to as the crossover point. Consider an arbiter to which two signals are repeatably applied. A perfectly balanced arbiter would output a 1 in half of the trials and a 0 in the other half of the trials when inputs to the arbiter are exactly simultaneous. If one input is leading, the fraction of the trials in which the arbiter outputs a 1 goes up. If the other input is leading, the fraction of the trials in which the arbiter outputs a 0 goes up. The "crossover point," where probability of a 1 output equals the probability of a 0 output, can be said to be at 0 offset in this case. A real arbiter would have some imbalance. For example, when the inputs are simultaneous, it might output a 1 in ⅔ of the trials, and a 0 in the other ⅓ of the trials. It might output a 1 in half the trials and a 0 in the other half of the trials if the one input signal is 10 picoseconds later than the other. In that case, the arbiter may be said to have a crossover point of 10 picoseconds. (If the signals were reversed, it would have a crossover point of −10 picoseconds).

When the same pair of signals are applied to different arbiters and the time difference between like edges in the pair of signals is smaller than that which the arbiter can resolve (i.e. dT<dW) then the possibility exists that the output signal provided by each arbiter can have different values. That is, one arbiter can provide an output signal having a first value which indicates that SigA arrived first while a second arbiter provides an output signal having a second value which indicates that SigB arrived first. This result is possible since manufacturing tolerances will change the characteristics of one arbiter as compared to another.

Referring again to FIG. 1, if each of the plurality of arbiters $12_1$, $12_2$ ... $12_N$, have a different transition or cross-over characteristic, by feeding both signals SigA and SigB to the arbiters 12, some percentage of arbiters 12 indicate that signal SigA arrived first and some percentage indicate that signal SigB arrived first. If the time difference dT between the two clock signals is large (e.g. dT>dW), then the percentage of arbiters 12 indicating that either signal SigA arrived first or that signal SigB arrived first will be large. As the time difference dT decreases, however, then the percentage of arbiters 12 indicating that signal SigA arrived first approaches the percentage of arbiters 12 indicating that signal SigB arrived first. Thus, if signal SigA and signal SigB arrived at the same time, then the percentage would approach 50% (i.e. substantially one-half the arbiters would indicate that SigA arrived first and substantially one-half the arbiters would indicate that SigB arrived first).

It should be noted that the probability of the random choice of arbiters 12 used to fabricate the arbiter array 28 should result in a normal distribution of cross-over times among the different arbiters 12 providing the advantages as contemplated herein.

Decision circuit 20 receives the signals from the arbiters 12 and provides, at an output port 24 thereof, a digital signal indicative of the percentage of arbiters 12 that indicated that signal SigA arrived first. Alternatively or in addition to the above, the decision circuit can provide the percentage of arbiters 12 that indicated that signal SigB arrived first. Alternatively still, decision circuit 20 can also provide at the output port 24, a signal representative of the percentage of arbiters 12 that indicated that SigA arrived first and indicative of the percentage of arbiters 12 that indicated that signal SigB arrived first.

In one embodiment, a plurality of 64 arbiters are used, and when the two signals, signal SigA and signal SigB are fed to the arbiters 12, if signal SigA arrives first by a predetermined amount of time (e.g. at least 2 picoseconds), then the value of the signal provided at output 24 by decision circuit 20 should indicate that a greater number of arbiters 12 provided an output signal having a high or a logic 1 value. Similarly, if signal SigB arrives at the arbiter 12 first by at least 2 picoseconds, then the value of the signal provided at output 24 by decision circuit 22 should indicate that a greater number of arbiters provided an signal having a low or a logic 0 value. The output 24 provides 40 different values providing approximately 2 picosecond step increments.

It should be appreciated that since each signal is provided to all of the arbiters 14 in the arbiter array 28, the differences in signal path lengths between the arbiters is not of concern. That is, the path lengths to each different arbiter need not be exactly matched, because mismatches in the path length simply add to the manufacturing variations in the arbiter. If the path difference is known, however, the digital circuit or system 10 can subtract out the difference in path delays from the apparent crossover points of the arbiters 14.

In some instances, it may be desirable to bias the different arbiters $12_1$, $12_2$ ... $12_N$ to ensure a normal or expanded distribution providing for an equal distribution of crossover time points among the different arbiters $12_1$, $12_2$ ... $12_N$. To accomplish the latter, for each arbiter 12, an optional bias circuit 26 is also included in the digital circuit 10. The bias circuit 26 is arranged to bias the arbiter 12 in one of a plurality of cross-over time positions such that a normal distribution providing for an equal distribution of cross-over time among the different arbiters $12_1$, $12_2$ ... $12_N$ is provided. In some instances, the bias circuit 26 is provided by utilizing arbiters including a transistor having characteristics to bias said arbiter with a cross-over point different than an adjacent arbiter. By controlling the junction characteristics of the transistors within the arbiter 12, the transistor can be biased to control the cross-over time of the arbiter. By utilizing arbiters having transistors that delay the cross-over time as well as arbiters having transistors that advanced the cross-over time as compared to an arbiter having a medium cross-over time, an arbiter array 28 can be provided with a plurality of cross-over times with a distribution providing for an equal or expanded distribution of cross-over time among the different arbiters $12_1$, $12_2$ ... $12_N$.

In other instances, it may be more advantageous to use discrete bias circuits to provide the bias circuit 26. In this embodiment, discrete elements are added to the arbiter array 28 to bias the different arbiters $12_1$, $12_2$ ... $12_N$ with a plurality of different crossover times such that each bias circuit is providing bias to a corresponding one of the plurality of arbiters with each arbiter 12 being biased with a different cross-over point than an adjacent arbiter 12.

In most applications, it would be desirable to integrate the digital circuit 10 onto an integrated circuit, so that clock networks can be tested in situ. Alternatively, the digital circuit 10 can be provided as part of a test apparatus. When provided as part of a test apparatus, the test circuit 10 can be custom deigned such that it integrates directly with the device under test (DUT). Additionally, the digital circuit 10 can be used in a communication circuit where it is desirable to measure the difference in two timing sources such that the two timing sources can be synchronized.

Figure 3:
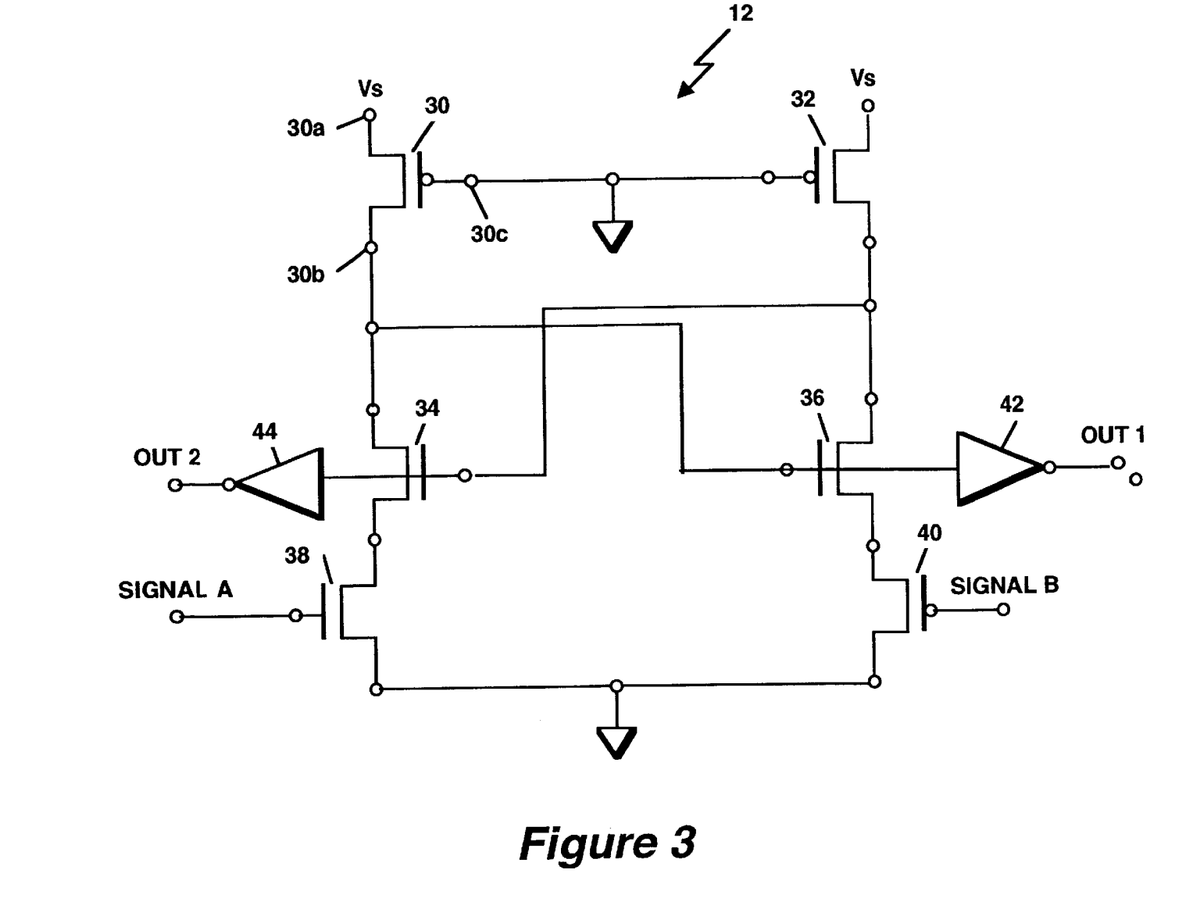
FIG. 3 is a schematic of an exemplary arbiter.

Referring now to FIG. 3, a typical arbiter 12 is shown to include a plurality of field effect transistors (FETs) 30, 32, 34, 36, 38 and 40 arranged as shown. Taking FET 30 as representative of FETs 32–40, each of the FETs is provided having first and second bias terminals 30a–40a, 30b–40b and a control terminal 30c–40c.

FETs 34, 36, 38 and 40 are arranged as a flip-flop as is known in the art. Signal SigA is fed to the gate of FET 38 as shown. Signal SigB is fed to the gate of FET 40 as shown. A first output, Out1, is coupled from the gate of FET 36 by buffer 42. A second output, Out2, is coupled from the gate of FET 34 by buffer 44. FET 30 buffers FET 34 from the voltage supply Vs. FET 32 buffers FET 36 from the voltage supply Vs. Operation of the typical arbiter 12 is as follows. At a first instance of time, if SigA and SigB are low, then FETs 38 and 40 are turned off and the gates of FET 34 and FET 36 are high which when passed through the buffers 42, 44 are inverted to make Out1 and Out2 low. If SigA goes high, then FET 38 is turned on, which lowers the voltage at the gate of FET 36 which makes Out1 go high. If SigB goes high, then FET 40 is turned on, which lowers the voltage at the gate of FET 34 which makes Out2 go high. The latter is well known in the art. The output of arbiter 12 is fed to the decision circuit 20.

One way to bias the arbiter 12 is to choose transistors 38 and 40 to have different junction sizes. For example, if in the default circuit both transistors have a width of 8, we might bias the arbiter 12 by choosing a width of 7 for transistor 38, and a width of 9 for transistor 40. Instead of, or in addition to that, we could intentionally mismatch transistors 34 and 36, and/or transistors 30 and 32. The latter would be the simplest way to bias the arbiters. Alternatively, we might arrange to have a set of arbiters mismatched by arranging the circuit such that the widths of a pair of the above mentioned transistors take the values, for example, ([7,9], [7.2,8.8], [7.4,8.6] . . . [8,8] . . . [8.8, 7.2] . . . [9,7]).

Another approach to bias the arbiter 12 would be connect the gates of transistors 30 and 32 to separate signals, say signal G30 and signal G32, instead of to ground as is now shown. One could then unbalance the transistor by mismatching signal G30 and signal G32. Similarly, one might have independent control over the bulk, or back-gate voltage of one of the pair of transistors; unbalancing the back-gate voltage for any pair of transistors would also unbalance the arbiter. One might accomplish this by developing a voltage across a resistor, tapping the resistor at a number of points, and connecting each individual one of the taps to the bulk, or back-gate, of one transistor.

Still another approach to bias the arbiter 12 would be to simply add delays in series with one of the inputs to the arbiter and not the other input, or add varying known delays, perhaps by inserting a series resistor and parallel capacitor of varying sizes to the inputs.

Figure 4:
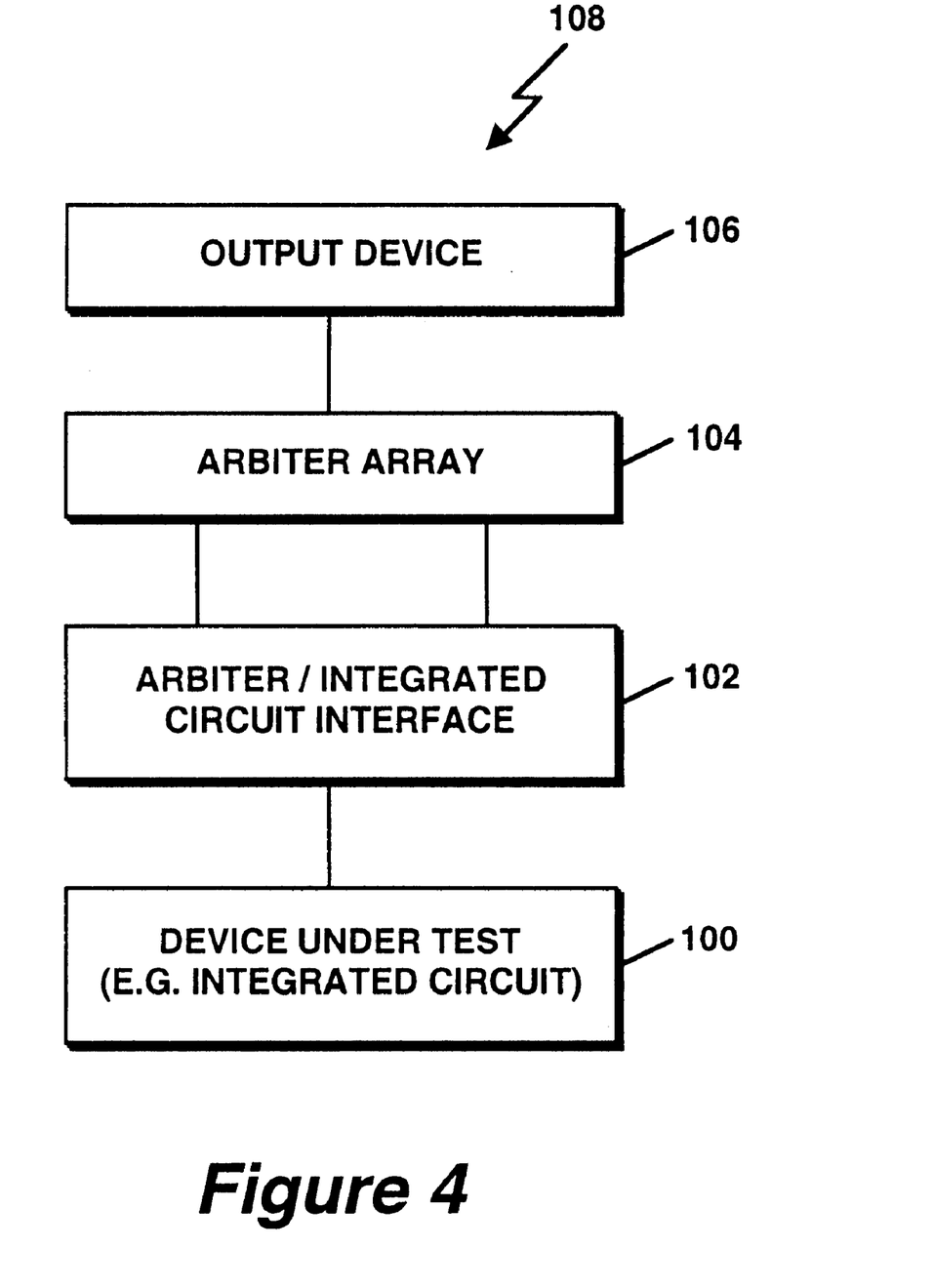
FIG. 4 is a block diagram of a test circuit coupled to a device under test.

Referring now to FIG. 4, a block diagram of an arbiter array test system 108 coupled to a device under test (DUT) 100 is shown. The DUT 100 may be, for example, as an integrated circuit such as a microprocessor, a communication circuit or other device. In a typical application, the arbiter array test system 108 would be incorporated in the topology of the device under test 100. Alternatively, the DUT 100 could be a separate structure connected to the arbiter array test system 108. The DUT 100 is coupled through an arbiter interface circuit 102 to an arbiter array 104. The interface circuit 102 typically includes a switching circuit with lead lines and a buffer to connect one of the test points to one of the inputs of the arbiter array 104 and a second one of the test points to a second one of the inputs of the arbiter array 104. The arbiter array 104 receives signals from the DUT 100 and in response to the received signals, the arbiter array 104 can measure the difference in arrival times between clock edges for each edge from various test points in the DUT 100. The information is communicated to a user through an output device 106. With such an arrangement, the time difference between digital signal edges can be measured which in turn can be used to provide jitter measurement, debug communication systems, etc.

Figure 5:
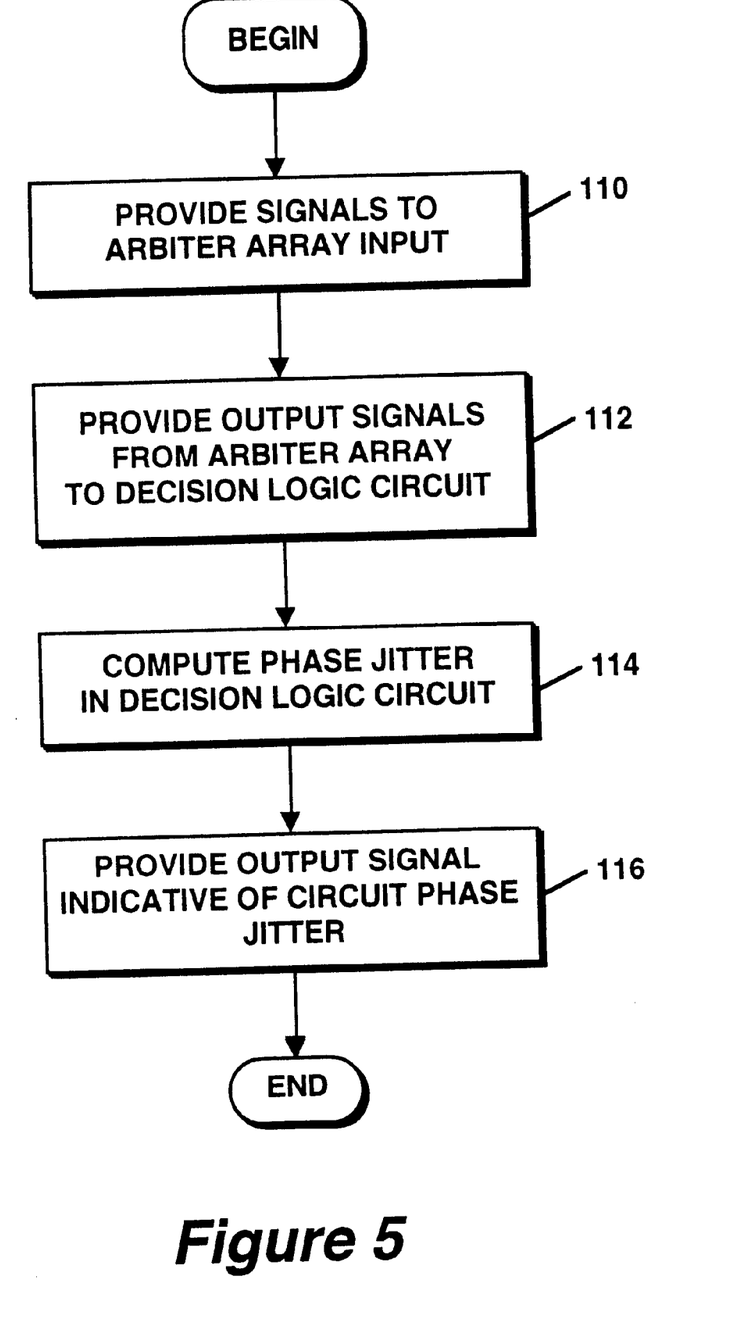
FIG. 5 is a flow diagram illustrating the steps to compute phase jitter in a circuit.

FIG. 5 is a flow diagram showing the processing performed by a processing apparatus which may, for example, be provided as part of a decision logic circuit 20 (FIG. 1) to determine which of two signals arrived first at a particular node or point in a circuit. The rectangular elements (typified by element 110 in FIG. 7), herein denoted "processing blocks," represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention.

Turning now to FIG. 5, a flow diagram which illustrates the steps performed by decision circuit 20 to measure the phase jitter on an integrated circuit is shown. Processing begins in step 110 where at least a pair of signals are fed to an array of arbiters. In one particular embodiment, the signals correspond to a pair of clock signals. In response to receiving the input signals, the arbiters provide output signals at each output ports to the inputs of a decision circuit as shown in step 112. It should be appreciated and as explained above, the value of the output signal provided by the arbiter depends upon which clock signal arrives first at the arbiter. In determining, in each arbiter in the array of arbiters, which signal arrived first at the arbiter, the arbiters can be biased using any of the techniques explained above in conjunction with FIG. 1.

Processing then flows to step 114 where the inputs to the decision circuit from the plurality of arbiters are tabulated and used to determine more precisely the difference in arrival time between the leading edges of the pulses of the pair of signals. From the percentage of arbiters showing that the arrival time of a pulse of one signal arrived before the arrival time of a pulse of a second signal, a value of the time difference, dT, can be determined. From the latter, phase jitter can be computed.

Jitter is the temporal variation in time difference between two edges. Jitter at a single node may be determined by iteratively comparing the difference between the edges of the clock at that node and the clock supplied by a reference clock. More generally, the jitter between any two clocks, either both in the system under test or one in the system under test and one external reference, may be computed by repeatedly measuring the time difference between rising edges of the two clocks, and tabulating the results. The peak-to-peak jitter is the difference between the minimum and maximum measured time differences. Thus, the information provided by the output signals of the arbiters are utilized to characterize the jitter of a circuit from which the clock signal originated. Alternatively, the statistics of the difference in edge arrival times can be provided or can be used for testing digital communications systems or other applications.

Processing then proceeds to step 116 where an output signal indicative of the results of step 114, here the amount of jitter, is provided. Processing then ends.

All publications and references cited herein are expressly incorporated herein by reference in their entirety.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. A digital circuit comprising:
   a plurality of arbiters, each arbiter having first and second input ports and an output port providing an output signal, each first input of the plurality of arbiters connected to a first common line and each second input of the plurality of arbiters connected to a second common line, said output signal going high if a first input signal is high and a second input signal is low; and
   a decision circuit, having a plurality of inputs and an output, a corresponding one of the inputs of the decision circuit connected to a corresponding output of one of the plurality of arbiters, said output providing a signal indicative of a difference of time between a signal fed to the first common line and a signal fed to the second common line.

2. The digital circuit as recited in claim 1 comprising:

a plurality of bias circuits, each bias circuit providing bias to a corresponding one of the plurality of arbiters with each arbiter being biased with a different cross-over point than an adjacent arbiter.

3. The digital circuit as recited in claim 1 wherein each one of the arbiters comprises a transistor having a characteristic to bias said arbiter with a cross-over point different than another one of the arbiters.

4. The digital circuit as recited in claim 1 further comprising a interface circuit to couple each of said plurality of arbiter circuits to two of a plurality of test points of a device under test.

5. The digital circuit as recited in claim 1 wherein said decision circuit comprises:

a determination processor for determining the number arbiter circuits providing a high level input signal to said decision circuit; and a phase jitter computation processor coupled to said determination processor means for computing phase jitter from the information provided thereto by said determination processor.

6. The digital circuit as recited in claim 1 wherein each one of the arbiters comprises a plurality of transistors, each having predetermined electrical characteristics to provide each of said arbiters having a different cross-over point.

7. A method of indicating a time difference between edges of two digital signal pulses comprising the steps of:

(a) providing a first signal to a first input of a plurality of arbiters, each arbiter having a first and second input and an output;

(b) providing a second signal to a second input of a plurality of arbiters, wherein in response to the received signals each of said plurality of arbiters provide an output signal, each output signal having one of first and second different values; and (c) determining the number of arbiters providing an output signal having the first value.

8. The method as recited in claim 7 further comprising the step of:

(d) determining the number of arbiters providing an output signal having the second value.

9. The method as recited in claim 8 further comprising the step of using the number determined in step (d) to estimate phase jitter.

10. The method as recited in claim 7 further comprising the step of providing bias to a corresponding one of the plurality of arbiters with each arbiter being biased with a different cross-over point than an adjacent arbiter.

11. The method as recited in claim 7 further comprising the step of providing each one of the arbiters with a transistor having a characteristic to bias said arbiter with a cross-over point different than another one of the arbiters.

12. The method as recited in claim 7 further comprising the steps of computing phase jitter from the information provided by the plurality of arbiters.

13. A circuit to measure arrival time differences in a clock network of a high-speed, high performance integrated circuit, comprising:

a plurality of arbiters each of said plurality of arbiters includes first and second input ports each adapted to receive a clock signal and an output port;

a decision logic circuit coupled to each the output port of each of said plurality of adapter circuits; and a plurality of bias circuits, each bias circuit providing bias to a corresponding one of the plurality of arbiters with each arbiter being biased with a different cross-over point than an adjacent arbiter.

14. The circuit as recited in claim 13 wherein the circuit resolves cycle-by-cycle jitter with an on-chip resolution which is better than 10 picosecond.

15. The circuit as recited in claim 13 wherein each one of the arbiters comprises a transistor having a characteristic to bias said arbiter with a cross-over point different than another one of the arbiters.

16. The circuit as recited in claim 13 wherein said decision circuit comprises:

a determination processor for determining the number arbiter circuits providing a high level input signal to said decision circuit; and a phase jitter computation processor coupled to said determination processor means for computing phase jitter from the information provided thereto by said determination processor.

17. A circuit to measure phase jitter in a serial communication system, where high-speed phase measurement is needed, the circuit comprising:

(a) an arbiter array, said arbiter array including a plurality of arbiters, each arbiter having first and second input ports and an output port providing an output signal, each first input of the plurality of arbiters connected to a first common line and each second input of the plurality of arbiters connected to a second common line, said output signal having a first value if a first input signal is high and a second input signal is low; and (b) means, coupled to said arbiter array, said means for providing a first signal having a first output signal with a value indicative of the number of the plurality of arbiters in said arbiter array provide an output signal having a first value and the number of the plurality of arbiters are providing a signal having a second different value.

18. A method comprising the steps of:

(a) feeding a pair of clock signals to an array of arbiters;

(b) determining, in each arbiter in the array of arbiters, which signal arrived first at the arbiter;

(c) providing, in each arbiter in the array of arbiters, an output signal which indicates which of the two clock signals arrived first at the arbiter; and (d) utilizing the information provided by the output signal of each of the array of arbiters to characterize the time difference between the signals.

19. The method as recited in claim 18 further comprising the step of determining, from the time difference between the signals, jitter of a circuit from which the clock signal originated.

* * * * *

UNITED STATES PATENT AND TRADEMARK OFFICE
CERTIFICATE OF CORRECTION

PATENT NO.   : 6,661,860 B1
DATED        : December 9, 2003
INVENTOR(S)  : Vadim Gutnik et al.

It is certified that error appears in the above-identified patent and that said Letters Patent is hereby corrected as shown below:

<u>Title page,</u>
Item [57], ABSTRACT,
Line 15, reads "cam" and should read -- can --.

<u>Column 1,</u>
Line 13, reads "certain-" and should read -- certain --.

<u>Column 2,</u>
Line 27, reads "cross-over" and should read -- crossover --.

<u>Column 3,</u>
Line 3, reads "is chart" and should read -- is a chart --.
Line 5, reads "are an" and should read -- are --.
Line 5, reads "diagram" and should read -- diagrams --.
Line 23, reads "will provides" and should read -- will provide --.

<u>Column 5,</u>
Line 10, reads "cross over" and should read -- crossover --.
Line 24, reads "14cthe" and should read -- 14c. The --.
Line 44, reads "some the" and should read -- some of the --.

<u>Column 7,</u>
Lines 7 and 29, reads "cross-over" and should read -- crossover --.
Line 49, reads "an signal" and should read -- a signal --.

<u>Column 8,</u>
Lines 1, 2, 6, 9, 11, 12, 13, 14 and 24, reads "cross-over" and should read -- crossover --.
Line 12, reads "advanced" and should read -- advance --.
Line 31, reads "deigned" and should read -- designed --.
Line 47, reads "supply vs." and should read -- supply. --.

<u>Column 10,</u>
Line 8, reads "ports" and should read -- port --.

UNITED STATES PATENT AND TRADEMARK OFFICE
CERTIFICATE OF CORRECTION

PATENT NO. : 6,661,860 B1
DATED : December 9, 2003
INVENTOR(S) : Vadim Gutnik et al.

It is certified that error appears in the above-identified patent and that said Letters Patent is hereby corrected as shown below:

Column 11,
Lines 8, 12, 30 and 54 reads "cross-over" and should read --crossover--.
Line 15, reads "a interface" and should read -- an interface --.

Column 12,
Line 4, reads "each the" and should read -- each of the --.
Line 4, reads "port" and should read --ports--.
Line 9, reads "cross-over" and should read -- crossover --.
Line 13, reads "picosecond." and should read -- picoseconds. --.
Line 16, reads "cross-over" and should read -- crossover --.
Line 21, reads "number" and should read -- number of --.
Line 41, reads "(b) means" and should read -- (b) a means --.

Signed and Sealed this

Third Day of August, 2004

JON W. DUDAS
*Acting Director of the United States Patent and Trademark Office*